United States Patent
Wang et al.

(10) Patent No.: US 11,068,090 B2
(45) Date of Patent: Jul. 20, 2021

(54) ELECTROLUMINESCENT DISPLAY PANEL WITH REDUCED THICKNESS, PRODUCTION METHOD, DRIVING METHOD AND DISPLAY APPARATUS

(71) Applicant: BOE Technology Group Co., Ltd., Beijing (CN)

(72) Inventors: Haisheng Wang, Beijing (CN); Xue Dong, Beijing (CN); Yingming Liu, Beijing (CN); Xiaoliang Ding, Beijing (CN); Chunwei Wu, Beijing (CN); Rui Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 147 days.

(21) Appl. No.: 16/078,606

(22) PCT Filed: Dec. 15, 2017

(86) PCT No.: PCT/CN2017/116349
§ 371 (c)(1),
(2) Date: Aug. 21, 2018

(87) PCT Pub. No.: WO2018/126871
PCT Pub. Date: Jul. 12, 2018

(65) Prior Publication Data
US 2019/0050096 A1 Feb. 14, 2019

(30) Foreign Application Priority Data
Jan. 4, 2017 (CN) .......................... 201710005636.9

(51) Int. Cl.
*G06F 3/041* (2006.01)
*H01L 27/32* (2006.01)
(Continued)

(52) U.S. Cl.
CPC ......... *G06F 3/0412* (2013.01); *G02B 5/3058* (2013.01); *G06F 3/044* (2013.01);
(Continued)

(58) Field of Classification Search
CPC .... G06F 3/0412; G06F 3/04166; G06F 3/044; G06F 3/0445; G06F 3/0446;
(Continued)

(56) References Cited

U.S. PATENT DOCUMENTS

2005/0116629 A1* 6/2005 Takamura ........... H01L 51/5212
313/506
2009/0284135 A1* 11/2009 Yoshida .............. H01L 27/3283
313/504
(Continued)

FOREIGN PATENT DOCUMENTS

| CN | 102842271 | 12/2012 |
| CN | 103135841 | 6/2013 |

(Continued)

OTHER PUBLICATIONS

Chinese Search Report corresponding to Chinese Patent Application No. 201710005636.9 dated Apr. 28, 2017. (12 pages including English translation).
(Continued)

*Primary Examiner* — Keith L Crawley
(74) *Attorney, Agent, or Firm* — Myers Bigel, P.A.

(57) ABSTRACT

The present application provides an electroluminescent display panel, a production method, a driving method and a display apparatus. The electroluminescent display panel includes a light-emitting unit, a quarter-wave plate on the light-emitting unit, and a wire grid polarizer on a side of the quarter-wave plate opposite to the light-emitting unit. In particular, the light-emitting unit includes a driving backplane, a light-emitting layer and an electrode layer. The
(Continued)

electrode layer includes a plurality of sub-electrodes extending along a first direction and insulated from each other. In addition, the wire grid polarizer includes a plurality of metal wires extending along a second direction. The second direction intersects with the first direction.

15 Claims, 8 Drawing Sheets

(51) Int. Cl.
| | |
|---|---|
| *H01L 51/52* | (2006.01) |
| *H01L 51/56* | (2006.01) |
| *G06F 3/044* | (2006.01) |
| *G09G 3/3225* | (2016.01) |
| *G02B 5/30* | (2006.01) |

(52) U.S. Cl.
CPC ........ *G09G 3/3225* (2013.01); *H01L 27/3211* (2013.01); *H01L 27/3276* (2013.01); *H01L 51/5253* (2013.01); *H01L 51/56* (2013.01); *G02B 5/3083* (2013.01); *G06F 2203/04103* (2013.01); *G06F 2203/04112* (2013.01); *G09G 2320/0233* (2013.01); *H01L 27/323* (2013.01); *H01L 51/5225* (2013.01); *H01L 51/5281* (2013.01); *H01L 2227/323* (2013.01)

(58) Field of Classification Search
CPC . G06F 2203/04103; G06F 2203/04112; G02B 5/3025; G02B 5/3058; G02B 5/3083; G09G 3/3208; G09G 3/30; G09G 3/32; G09G 3/3225; G09G 2320/0233; H01L 27/32; H01L 27/3211; H01L 27/323; H01L 27/3244; H01L 27/3246; H01L 27/326; H01L 27/3276; H01L 51/5225; H01L 51/5253; H01L 51/5281; H01L 51/56; H01L 51/5293; H01L 2227/323
See application file for complete search history.

(56) References Cited

U.S. PATENT DOCUMENTS

| | | |
|---|---|---|
| 2012/0327336 A1 | 12/2012 | Jeon et al. |
| 2013/0021289 A1 | 1/2013 | Chen et al. |
| 2013/0127776 A1 | 5/2013 | Guard et al. |
| 2014/0210767 A1* | 7/2014 | Hur ........................ H01L 27/323 345/174 |
| 2015/0103032 A1* | 4/2015 | Bell ....................... G06F 3/0412 345/174 |
| 2016/0103536 A1* | 4/2016 | Xiong ................... G06F 3/0412 345/173 |
| 2016/0147113 A1* | 5/2016 | Chang ............... G02F 1/133528 349/12 |
| 2016/0149166 A1 | 5/2016 | Kwong |
| 2016/0188119 A1 | 6/2016 | Ham et al. |
| 2016/0231844 A1* | 8/2016 | Lee ..................... G02F 1/13338 |
| 2017/0075471 A1* | 3/2017 | Hong .................. G02F 1/13338 |
| 2017/0090644 A1* | 3/2017 | Yao ........................ H01L 27/323 |
| 2017/0220150 A1* | 8/2017 | Wu ....................... H01L 51/5225 |
| 2017/0220158 A1 | 8/2017 | Peng et al. |
| 2018/0039354 A1 | 2/2018 | Xu et al. |
| 2018/0108716 A1* | 4/2018 | Xu .......................... G09F 9/301 |
| 2019/0050096 A1 | 2/2019 | Wang et al. |

FOREIGN PATENT DOCUMENTS

| | | |
|---|---|---|
| CN | 103748538 | 4/2014 |
| CN | 104991683 | 10/2015 |
| CN | 105468201 | 4/2016 |
| CN | 105573569 | 5/2016 |
| CN | 105702205 | 6/2016 |
| CN | 105761623 | 7/2016 |
| CN | 106226856 | 12/2016 |
| CN | 106505091 | 3/2017 |

OTHER PUBLICATIONS

First Office Action corresponding to Chinese Patent Application No. 201710005636.9 dated Jul. 25, 2017. (15 pages including English translation).

Second Office Action corresponding to Chinese Patent Application No. 201710005636.9 dated Nov. 16, 2017. (9 pages including English translation).

Third Office Action corresponding to Chinese Patent Application No. 201710005636.9 dated Feb. 13, 2018. (7 pages including English translation).

International Search Report and Written Opinion of the International Searching Authority corresponding to International Patent Application No. PCT/CN2017/116349 dated Mar. 22, 2018. (17 pages including English translation).

* cited by examiner

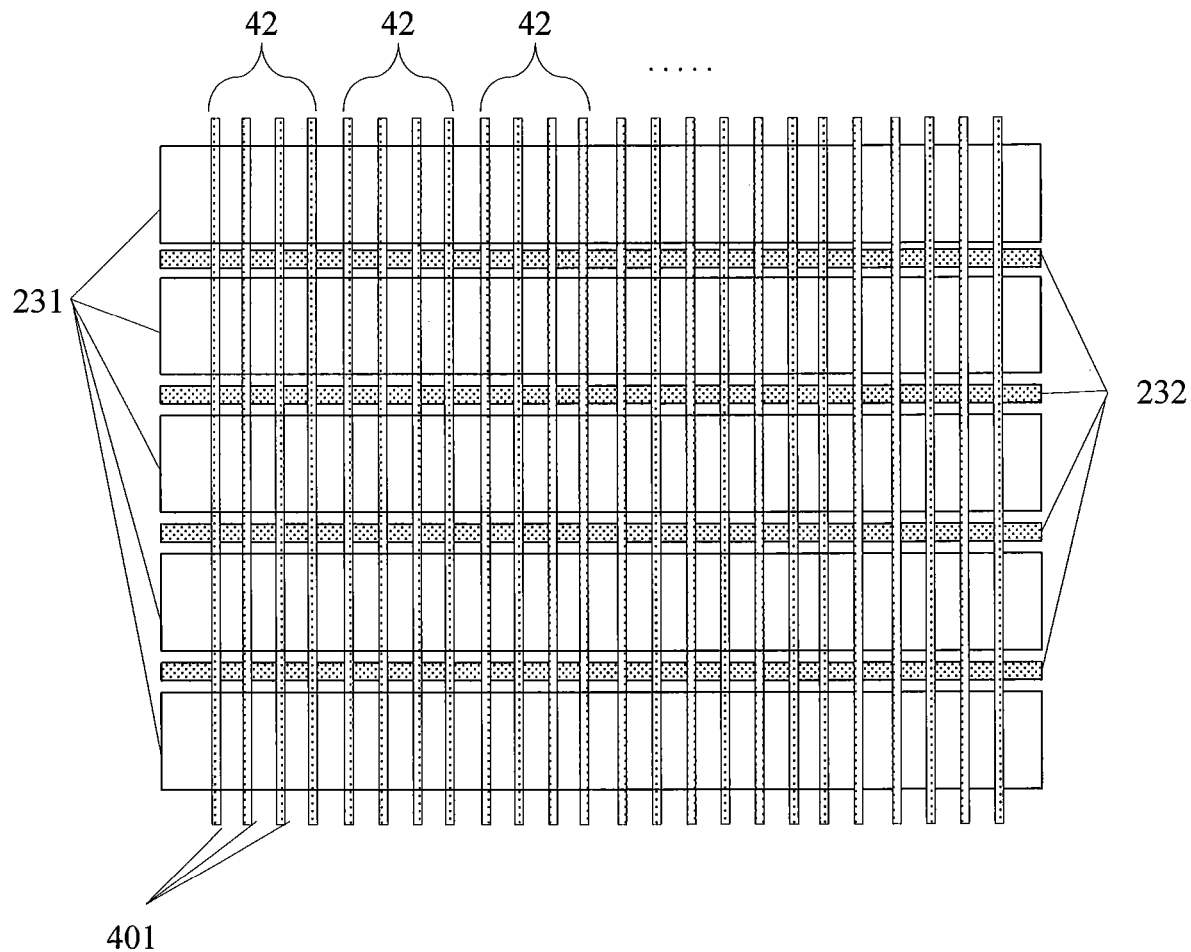

Fig. 10

| forming a light-emitting layer and an electrode layer sequentially on a driving backplane, wherein the electrode layer comprises a plurality of sub-electrodes extending along a first direction and insulated from each other. | 101 |

↓

| forming a quarter-wave plate and a wire grid polarizer sequentially on the electrode layer, wherein the wire grid polarizer comprises a plurality of metal wires extending along a second direction. | 102 |

Fig. 11

ELECTROLUMINESCENT DISPLAY PANEL WITH REDUCED THICKNESS, PRODUCTION METHOD, DRIVING METHOD AND DISPLAY APPARATUS

CROSS REFERENCE TO RELATED APPLICATIONS

The present application is a 35 U.S.C. 371 national stage application of PCT International Application No. PCT/CN2017/116349, filed on Dec. 15, 2017, which claims the benefit of Chinese patent application No. 201710005636.9, filed on Jan. 4, 2017, the contents of which are incorporated herein by reference in their entireties. The above-referenced PCT International Application was published in the Chinese language as International Publication No. WO 2018/126871 A1 on Jul. 12, 2018.

TECHNICAL FIELD

The present application relates to the field of display, and in particular, to an electroluminescent display panel, a production method, a driving method and a display apparatus.

BACKGROUND

Current display types mainly comprise liquid crystal displays (LCDs), organic light emitting diode (OLED) displays, plasma display panel (PDP) displays and electronic ink displays, etc. In OLED displays, active matrix organic light emitting diode (AMOLED) displays are a new type of display device. They have characteristics of high chroma, high contrast, wide viewing angle, high brightness, self-luminous, rapid response speed, achievable flexible display, etc., and have been recognized as the mainstream technology for the next generation of flat panel displays.

SUMMARY

The present application provides an electroluminescent display panel, a production method, a driving method, and a display apparatus.

According to an aspect, the present application provides an electroluminescent display panel. The electroluminescent display panel comprises a light-emitting unit, a quarter-wave plate disposed on the light-emitting unit and a wire grid polarizer disposed on a side of the quarter-wave plate opposite to the light-emitting unit. In particular, the light-emitting unit comprises a driving backplane, a light-emitting layer and an electrode layer. The electrode layer comprises a plurality of sub-electrodes extending along a first direction and insulated from each other, wherein the sub-electrodes transmit an electrode signal during a display stage of the display panel and transmit a touch driving signal during a touch stage of the display panel. In addition, the wire grid polarizer comprises a plurality of metal wires extending along a second direction, wherein at least some of the metal wires constitute a touch sensing electrode and transmit a touch sensing signal during the touch stage of the display panel. Herein, the second direction intersects with the first direction.

It needs to be noted that, in the electroluminescent display panel provided by the present disclosure, the electrode layer comprises a cathode layer or an anode layer. In addition, it also needs to be noted that, in the above electroluminescent display panel, the driving backplane typically comprises a TFT array and a further electrode, that is, an additional electrode which has a polarity opposite to that of the electrode layer as mentioned above and cooperates with it. Herein, for the purpose of simplicity, such a further electrode and the TFT array as a whole are referred to as the driving backplane in the present application.

According to a specific embodiment, the plurality of metal wires constitutes touch sensing electrodes, and each of the touch sensing electrodes comprises several adjacent metal wires.

According to a specific embodiment, the light-emitting layer further comprises a plurality of sub-pixel units distributed in an array. The orthographic projection of one or more of the plurality of metal wires on the light-emitting layer coincides with that of a gap between adjacent rows or adjacent columns of sub-pixel units on the light-emitting layer, therefore constituting a sub-sensing electrode, wherein several adjacent sub-sensing electrodes constitute a touch sensing electrode. Herein, it needs to be noted that, the expression of "orthographic projection of . . . on the light-emitting layer" refers to an projection along a direction perpendicular to the light-emitting layer.

According to a specific embodiment, metal connection wires are further disposed between the one or more metal wire constituting each sub-sensing electrode, and these metal connection wires and the corresponding one or more metal wire constitute a mesh-like structure.

According to a specific embodiment, the light-emitting unit further comprises an insulating barrier located on the light-emitting layer. Such an insulating barrier is further disposed between adjacent rows or adjacent columns of sub-pixel units, and used for dividing the electrode layer into the plurality of sub-electrodes.

According to a specific embodiment, in the above proposed electroluminescent display panel, an encapsulating film is further disposed between the light-emitting unit and the quarter-wave plate.

According to a specific embodiment, the electroluminescent display panel as mentioned above further comprises a substrate plate disposed on a side of the light-emitting unit opposite to the quarter-wave plate, and the wire grid polarizer further comprises a wire grid polarizer substrate, wherein materials of the wire grid polarizer substrate and the substrate plate are the same.

According to a specific embodiment, the electroluminescent display panel as mentioned above comprises a quantum dot light emitting display panel or an OLED display panel, in particular, an AMOLED display panel.

According to another aspect, the present application further provides a display apparatus comprising an electroluminescent display panel according to any of the above embodiments.

According to yet another aspect, the present application further provides a production method for an electroluminescent display panel. In particular, the production method comprises: forming a light-emitting layer and an electrode layer sequentially on a driving backplane, wherein the electrode layer comprises a plurality of sub-electrodes extending along a first direction and insulated from each other; and forming a quarter-wave plate and a wire grid polarizer sequentially on the electrode layer, wherein the wire grid polarizer comprises a plurality of metal wires extending along a second direction, and the second direction intersects with the first direction.

According to a specific embodiment, the light-emitting layer further comprises a plurality of sub-pixel units distributed in an array. In this case, the production method further comprises: before forming the electrode layer, forming an insulating barrier on the light-emitting layer, wherein the insulating barrier is located between adjacent rows or adjacent columns of sub-pixel units. Further, the step of forming the electrode layer comprises: depositing an electrode metal film and patterning the electrode metal film to form the plurality of sub-electrodes, wherein the plurality of sub-electrodes are separated by the insulating barrier.

According to a specific embodiment, the production method further comprises: before forming the quarter-wave plate, forming an encapsulating film further on the electrode layer. According to a specific embodiment, the step of forming the wire grid polarizer on the electrode layer specifically comprises: forming metal connection wires between part of the metal wires of the wire grid polarizer, wherein the metal connection wires and that part of the metal wires constitute a mesh-like structure.

According to still another aspect, the present application further provides a driving method for an electroluminescent display panel as described above. The driving method comprises: loading a display signal to sub-electrodes of the electrode layer during a display stage; and loading a touch driving signal to sub-electrodes of the electrode layer and detecting a touch sensing signal by at least part of the metal wires of the wire grid polarizer during a touch stage. Herein, it needs to be noted that, in the above description, the display signals as applied to the individual sub-electrodes of the electrode layer are the same, such that the uniformity of display is guaranteed.

According to a specific embodiment, the light-emitting layer of the electroluminescent display panel further comprises a plurality of sub-pixel units distributed in an array. In this case, during the touch stage, the touch sensing signal is detected by a metal wire(s) corresponding to a gap between adjacent rows or adjacent columns of sub-pixel units.

BRIEF DESCRIPTION OF THE DRAWINGS

FIG. 10 is a structure diagram showing an arrangement for the cathode sub-electrodes and the metal wires of the wire grid polarizer according to another embodiment of the present application;

FIG. 11 illustrates a production flow chart of an OLED display panel according to an embodiment of the present application;

DETAILED DESCRIPTION OF THE EMBODIMENTS

Figure 1:
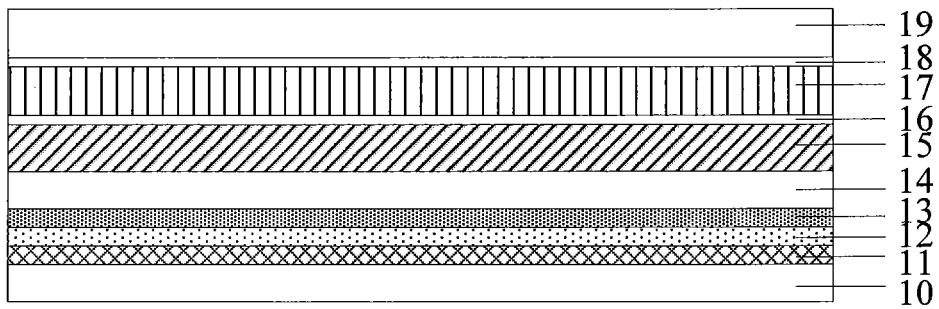
FIG. 1 illustrates a structure diagram of an existing AMOLED display panel.
Figure 2:
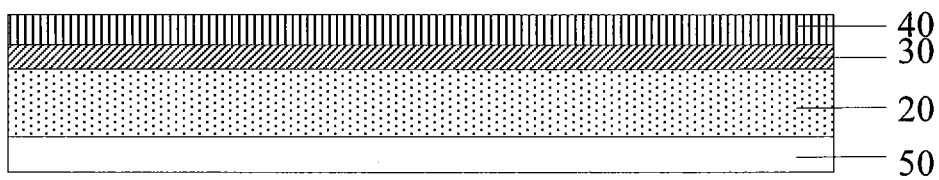
FIG. 2 illustrates a structure diagram of an OLED display panel according to an embodiment of the present application.
Figure 3:
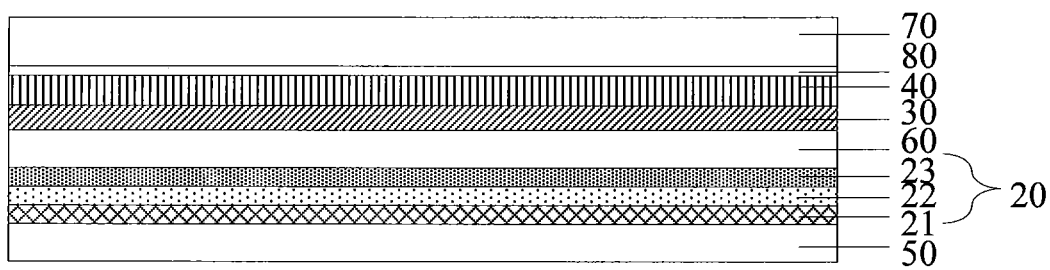
FIG. 3 illustrates a structure diagram of an OLED display panel according to another embodiment of the present application.

In the following, the implementation processes of embodiments of the present application will be described in detail in conjunction with drawings of the specification. It needs to be noted that, throughout the description, identical or similar reference signs denote identical or similar elements, or elements that have identical or similar functions. In the following, the embodiments described with reference to the drawing are exemplary, only used for explaining the present application, and cannot be construed as limiting the present application. Reference is made to FIG. 1, which shows a structure diagram of an existing AMOLED display panel. In particular, the AMOLED display panel comprises a driving backplane 11, a light emitting layer 12, a cathode layer 13, an encapsulating film 14, a touch screen 15, a first layer of double-sided adhesive 16, a circular polarizer 17, a second layer of double-sided adhesive 18 and a protective film 19 disposed sequentially on a substrate plate 10. In such a scheme, the touch screen 15 is generally further arranged with a touch driving electrode and a touch sensing electrode. That is, in the existing AMOLED display panels, a touch screen 15 will usually be disposed separately above the light emitting unit (including the driving backplane 11, the light emitting layer 12 and the cathode layer 13), and then a circular polarizer for reducing external light reflection and enhancing contrast will be disposed above the touch screen 15. For an AMOLED display panel with such a structure, problems exist such as a relatively thick structure, poor flexibility & tortuosity, and potentially low brightness. An embodiment of the present application provides an electroluminescent display panel, in particular, an OLED display panel. With reference to FIGS. 2-6, the display panel comprises a light-emitting unit 20, as well as a quarter-wave plate 30 and a wire grid polarizer 40 disposed sequentially on the light-emitting unit 20. The light-emitting unit 20 comprises a driving backplane 21, a light-emitting layer 22 and an electrode layer, in particularly, a cathode layer 23, wherein the cathode layer 23 comprises a plurality of cathode sub-electrodes 231 extending along a first direction and insulated from each other. Such cathode sub-electrodes 231 transmit a cathode signal during a display stage of the display panel and transmit a touch driving signal during a touch stage of the display panel. Further, the wire grid polarizer 40 comprises a plurality of metal wires 401 extending along a second direction, wherein at least part of the metal wires 401 constitute a touch sensing electrode 42, and such a touch sensing electrode 42 transmits a touch sensing signal during the touch stage of the display panel. Herein, the second direction intersects with the first direction. In a specific embodiment, the driving backplane may be an LTPS driving backplane. Optionally, the display panel further comprises a substrate plate 50 disposed under the driving backplane, as shown in FIG. 3. As an example, the substrate plate 50 may specifically be a flexible substrate plate. For example, the substrate plate 50 may specifically be a PET substrate. In addition, between the light-emitting unit 20 and the quarter-wave plate 30, an encapsulating film 60 may further be disposed. A protective film 70 may further be disposed over the wire grid polarizer 40. Such a protective film 70 may be attached to the wire grid polarizer 40 by a transparent double-sided adhesive 80 (e.g., OCA adhesive).

Figure 4:
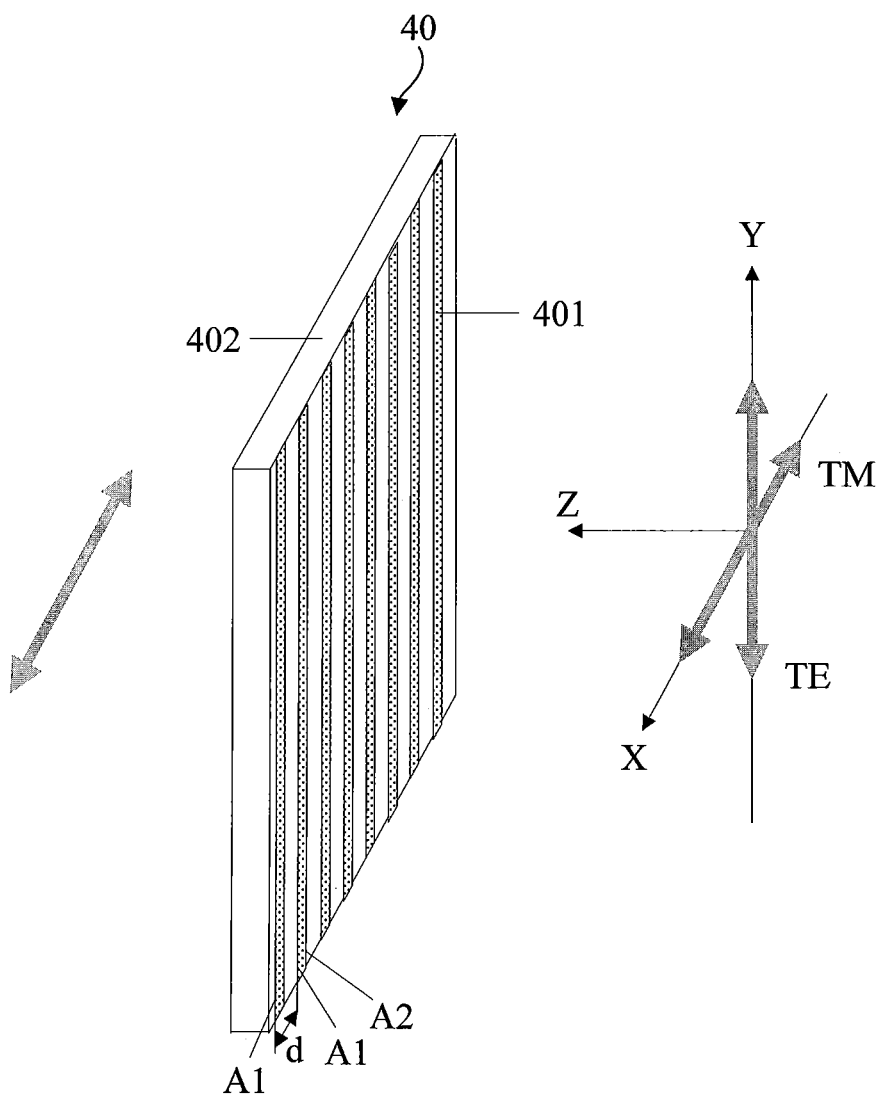
FIG. 4 illustrates a structure diagram of a wire grid polarizer according to an embodiment of the present application.

In the following, the wire grid polarizer 40 will be described with reference to FIG. 4. As shown in FIG. 4, metal wires 401 are usually formed on a wire grid polarizer substrate 402 of the wire grid polarizer 40 by way of imprinting. As an example, in particular, the wire grid polarizer substrate 402 may preferably be a PET substrate with the same material as that of the substrate plate of the OLED display panel on glass or a film. In such a case, the metal wires 401 are arranged on the wire grid polarizer substrate 402 in parallel at equal intervals, wherein the metal wires 401 vary periodically along the X-axis direction and are parallel to the Y-axis direction. The line width of the metal wires 401 is on the nanoscale. In particular, in a direction perpendicular to the extension direction of the metal wires, any of the metal wires has opposite first line edge A1 and second line edge A2, and the shortest distance d between the first line edge A1 of any of the metal wires and the first line edge A1 of an adjacent metal wire is 100-200 nm. Optionally, the line width of any of the metal wires is 75 nm, and the gap between adjacent metal wires is 75 nm. The electric field vector direction of a transverse electric field (TE) wave is along the Y-axis direction and parallel to the metal wires. In this direction, the electric field drives electrons in the metal wires to oscillate along the length direction of the metal wires. Thus, the electrons collide with atoms in the metal lattice, such that the TE wave is attenuated and in the meanwhile, it will be accompanied by radiation. The electric field vector of a transverse magnetic field (TM) wave is perpendicular to the metal wires in the X-Z plane. Since there is not enough space for electrons to move in this direction, they cannot move too far, and thereby both attenuation and radiation are decreased. This causes that the TM wave may pass through the metal wires with almost no change. In view of above, the wire grid polarizer 40 may cause the TM light to transmit and cause the TE light to be attenuated, thereby exhibiting the polarization effect.

In an embodiment of the present application, part or all of the metal wires in the wire grid polarizer 40 may transmit a touch sensing signal during the touch stage of the display panel.

That is, part or all of the metal wires 401 of the wire grid polarizer 40 may be reused as a touch sensing electrode 42. With respect to a case where part or all of the metal wires in the wire grid polarizer 40 are used as a sensing electrode, detailed illustration will be given by way of examples respectively in the following.

Figure 5:
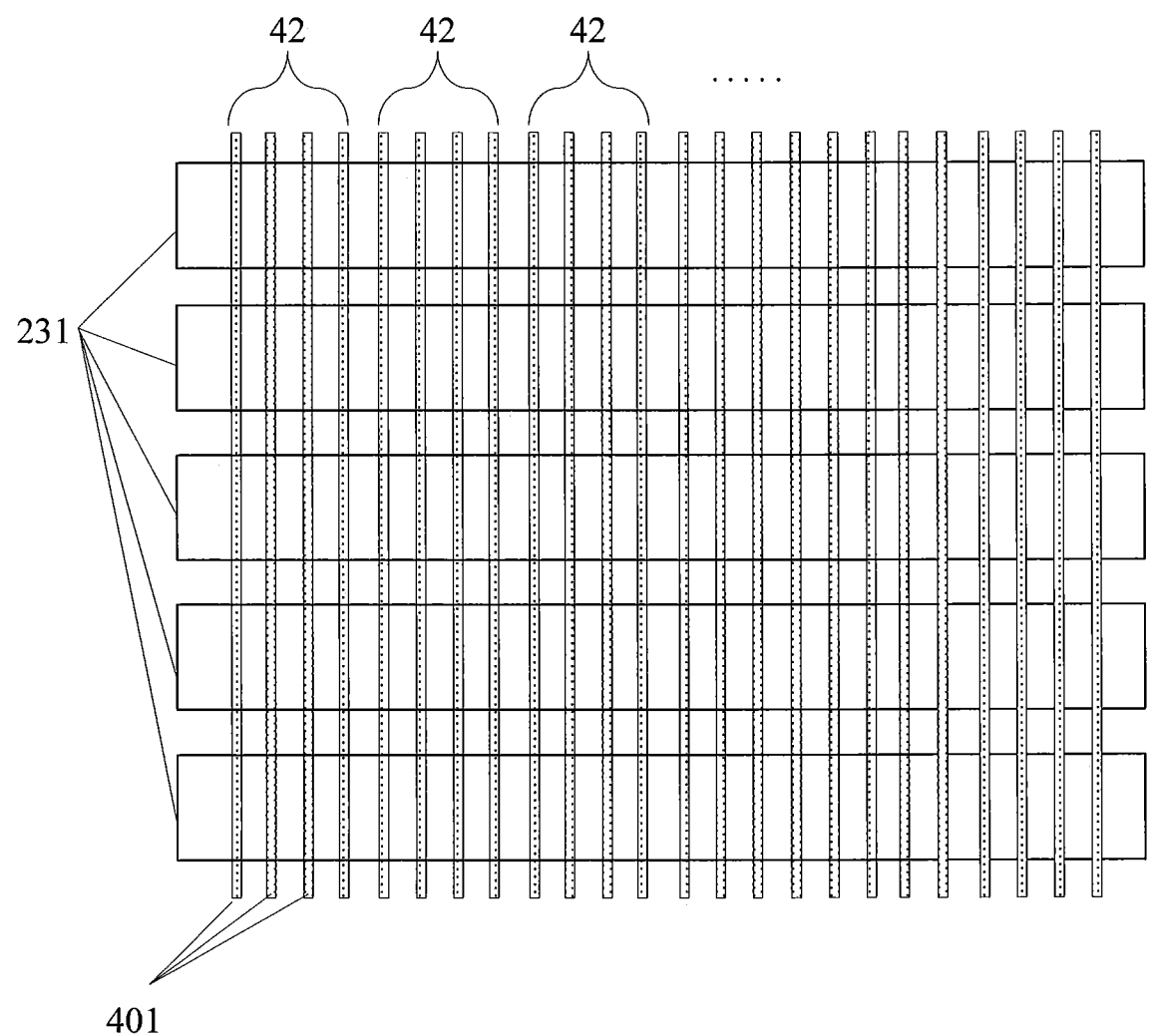
FIG. 5 illustrates a structure diagram of a wire grid polarizer according to an embodiment of the present application, wherein all the metal wires of the wire grid polarizer constitute a touch sensing electrode(s)

For example, as shown in FIG. 5, all of the metal wires 401 of the wire grid polarizer 40 may constitute a plurality of touch sensing electrodes 42. In particular, each touch sensing electrode 42 comprises several adjacent metal wires 401. Further optionally, the number of metal wires 401 comprised by each touch sensing electrode 42 is equal. Of course, the number of metal wires 401 comprised by each touch sensing electrode 42 may also be unequal. When the number of metal wires 401 comprised by each touch sensing electrode 42 is equal, it may be possible to simplify the production process of display panel and improve the production efficiency of display panel. In embodiments of the present application, by using all of the metal wires of the wire grid polarizer 40 as touch sensing electrodes, it may be possible to enable the wire grid polarizer 40 to have the function of a touch sensing electrode without changing the structure of wire grid polarizer 40. Thus, it may be possible to simplify the production process of display panel and improve the production efficiency of display panel. Of course, it should be appreciated that the number of metal wires constituting each touch sensing electrode 42 is less than the total number of metal wires in the wire grid polarizer.

Figure 6:
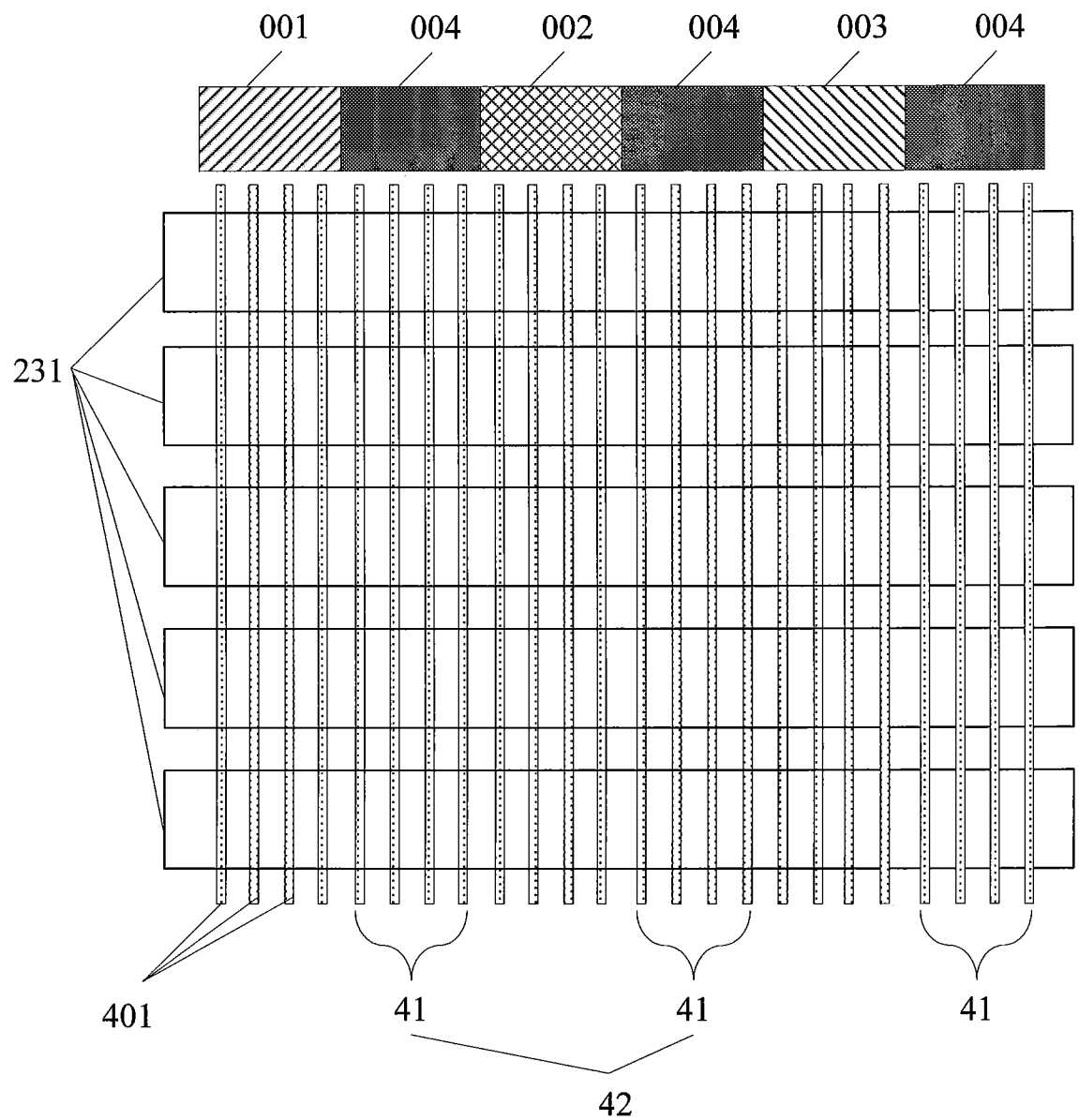
FIG. 6 illustrates a structure diagram of a wire grid polarizer according to an embodiment of the present application, wherein part of the metal wires of the wire grid polarizer constitutes a touch sensing electrode(s)

As another example, as shown in FIG. 6, part of the metal wires of the wire grid polarizer 40 may constitute a plurality of touch sensing electrodes. These metal wires constituting touch sensing electrodes may correspond to gaps between rows of sub-pixel units or columns of sub-pixel units. In general, the light-emitting layer of the OLED display panel generally comprises a plurality of pixel units, and each of the pixel units generally comprises a plurality of sub-pixel units. For example, each pixel unit comprises a red sub-pixel unit 001, a green sub-pixel unit 002 and a blue sub-pixel unit 003, wherein there is a gap 004 between adjacent sub-pixel units. In such a case, multiple sub-pixel units form rows of sub-pixel units and columns of sub-pixel units in the light-emitting layer 22 of the display panel. In a specific embodiment of the present application, optionally, metal wires corresponding to a gap 004 between rows of sub-pixel units or columns of sub-pixel units act as a sub-sensing electrode 41. That is, the orthographic projection of the metal wires comprised by each sub-sensing electrode 41 on the substrate plate of the display panel falls within the orthographic projection of a gap between rows of sub-pixel units or columns of sub-pixel units on the substrate plate of the display panel. Optionally, the two orthographic projections coincide completely. Further, a plurality of adjacent sub-sensing electrodes 41 constitutes a touch sensing electrode 42. In a specific embodiment, optionally, the number of sub-sensing electrodes 41 in each touch sensing electrode 42 may be equal. When the number of sub-sensing electrodes 41 in each touch sensing electrode 42 is equal, it may be possible to simplify the production process of display panel and improve the production efficiency of display panel. Of course, the number of sub-sensing electrodes 41 in each touch sensing electrode 42 may also be unequal. It needs to be noted that, in FIG. 6, only one row of sub-pixel units, as well as one specific arrangement for the cathode sub-electrodes and the metal wires of the wire grid polarizer are used for schematic illustration. It should be understood that, the pixel units of the light-emitting layer are located under the cathode layer and the wire grid polarizer, and the light-emitting layer has multiple rows and columns of sub-pixel units.

Figure 7:
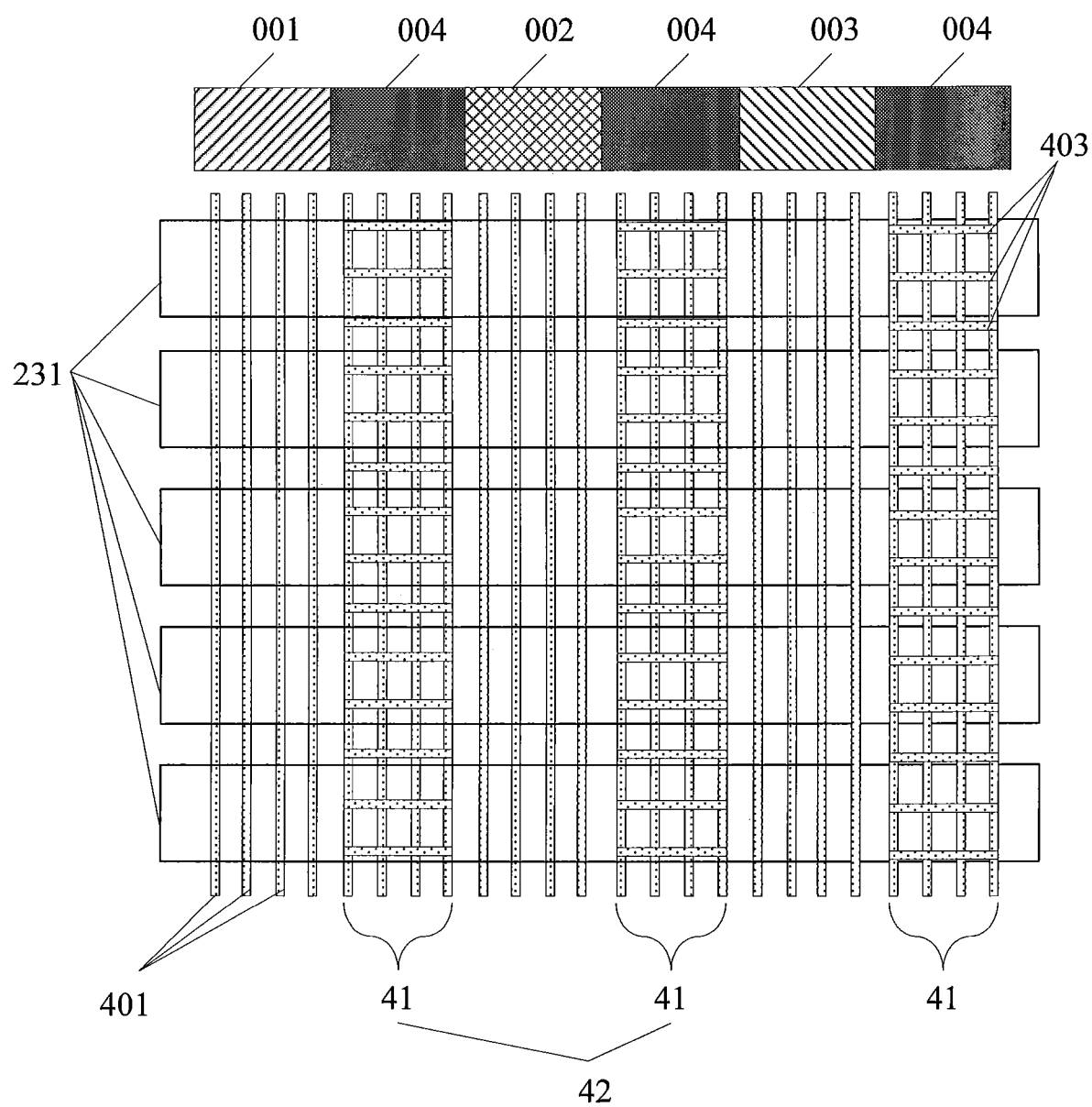
FIG. 7 illustrates a structure diagram of a wire grid polarizer according to another embodiment of the present application, wherein part of the metal wires of the wire grid polarizer constitutes a touch sensing electrode(s)

Optionally, as shown in FIG. 7, between metal wires 401 of each sub-sensing electrode 41 are further disposed metal connection wires 403, and the metal wires 401 of the sub-sensing electrode 41 and the metal connection wires 403 constitute a mesh-like structure. In embodiments of the present application, metal wires corresponding to a gap between rows of sub-pixel units or columns of sub-pixel units are selected for transmitting a touch sensing signal, and metal connection wires are disposed between the metal wires, such that the metal wires and the metal connection wires form a mesh-like structure. Hence, the resistance of touch sensing electrode may be reduced without affecting the polarization function of wire grid polarizer.

Figure 8:
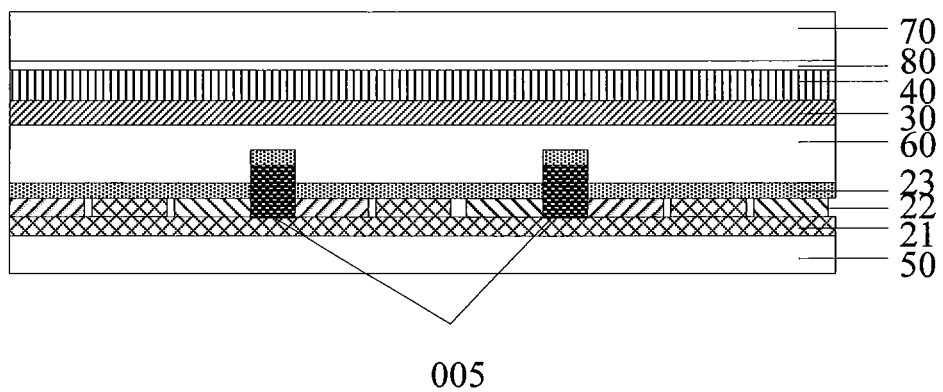
FIG. 8 illustrates a structure diagram of a display panel according to an embodiment of the present application, wherein a barrier is further disposed on the cathode layer.
Figure 9:
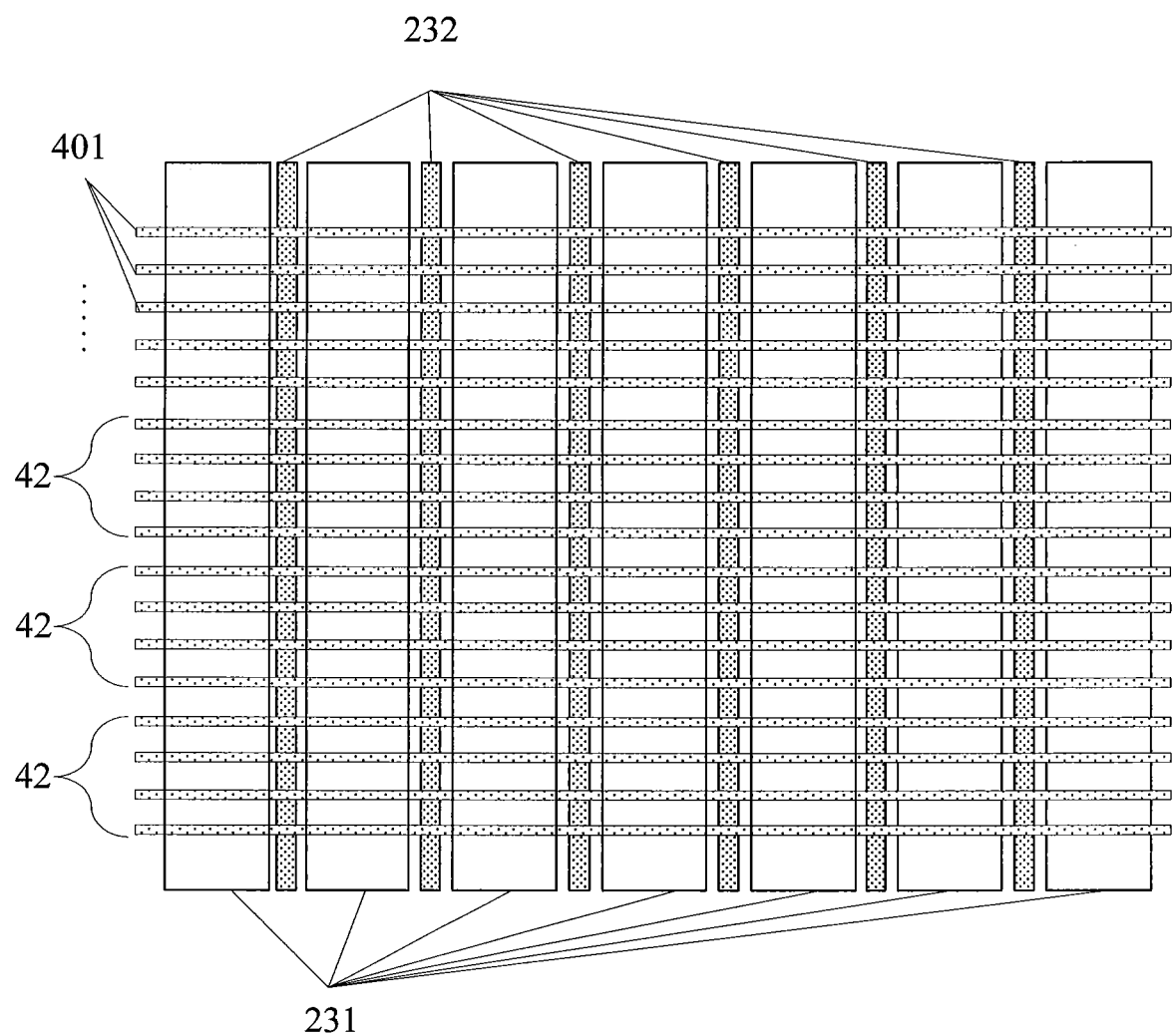
FIG. 9 is a structure diagram showing an arrangement for the cathode sub-electrodes and the metal wires of the wire grid polarizer according to an embodiment of the present application.

In the following, the cathode layer 23 of the light-emitting unit 20 will be described with reference to FIG. 8. As shown in FIG. 8, an insulating barrier 005 may be employed to realize division and insulation. For example, during the production of display panel, an insulating barrier 005 may be formed above the light-emitting layer 22 and at a place corresponding to a gap between rows of pixel units or columns of pixel units. Afterwards, a cathode film is then formed above the display panel provided with the insulating barrier 005. In this case, since the height of the area including the insulating barrier 005 is not the same as that of the area without the insulating barrier 005, the cathode layer 23 may be divided into a plurality of cathode sub-electrodes 231 insulated from each other when depositing the cathode film above. In an embodiment of the present application, an insulating barrier is formed in an area corresponding to a gap between rows of pixel units or columns of pixel units. Further, a plurality of insulating barriers is arranged along the same direction. In this way, division of the cathode layer may be realized without affecting the normal display of the display panel. Thus, the resulting insulating barriers have no corner, the production thereof is simple and the insulation performance thereof is good. In addition, it needs to be noted that, it is necessary to consider the arrangement direction of metal wires in the wire grid polarizer at the same time, whether an insulating barrier is formed at a gap between rows of pixel units, or an insulating barrier is formed at a gap between columns of pixel units. That is, the following is required as a prerequisite: the metal wires used as a sensing electrode and the cathode sub-electrodes used as a driving electrode are made to intersect with each other, thereby forming a capacitor. Optionally, the metal wires are perpendicular to the cathode sub-electrodes. That is, for example, the metal wires 401 of the wire grid polarizer are arranged according to the row direction, and an insulating barrier 232 is formed at a gap between columns of pixel units, such that the cathode sub-electrodes 231 are arranged according to the column direction, as shown in FIG. 9. If the metal wires 401 of the wire grid polarizer are arranged according to the column direction, an insulating barrier 232 is formed at a gap between rows of pixel units, such that the cathode sub-electrodes 231 are arranged according to the row direction, as shown in FIG. 10. Of course, for the arrangement of metal wires of the wire grid polarizer and cathode sub-electrodes, FIG. 9 and FIG. 10 are just a schematic illustration taking a case in which all of the metal wires of the wire grid polarizer are used as touch sensing electrodes as an example. For the arrangement of metal wires of the wire grid polarizer and cathode sub-electrodes, the same applies to a case in which part of the metal wires of the wire grid polarizer are used as touch sensing electrodes, and will not be repeated herein any more.

Optionally, the display panel comprises an AMOLED display panel.

An embodiment of the present application further provides a display apparatus. Such a display apparatus comprises an OLED display panel as provided by any of the above embodiments of the present application.

With reference to FIG. 11, an embodiment of the present application further provides a production method for an electroluminescent display panel (in particular, an OLED display panel). The production method comprises the following steps: step 101, forming a light-emitting layer and an electrode layer (a cathode layer as an example) sequentially on a driving backplane, wherein the electrode layer comprises a plurality of sub-electrodes (a plurality of cathode sub-electrodes as an example) extending along a first direction and insulated from each other; and step 102, forming a quarter-wave plate and a wire grid polarizer sequentially on the electrode layer, wherein the wire grid polarizer comprises a plurality of metal wires extending along a second direction.

Optionally, the production method may further comprise: forming metal connection wires between part of the metal wires of the wire grid polarizer, wherein the metal connection wires and that part of the metal wires constitute a mesh-like structure. In such a case, in the OLED display panel as formed ultimately, the mesh-like structure formed by the metal connection wires and the part of the metal wires corresponds to a gap between adjacent rows of sub-pixel units or adjacent columns of sub-pixel units.

Figure 12:
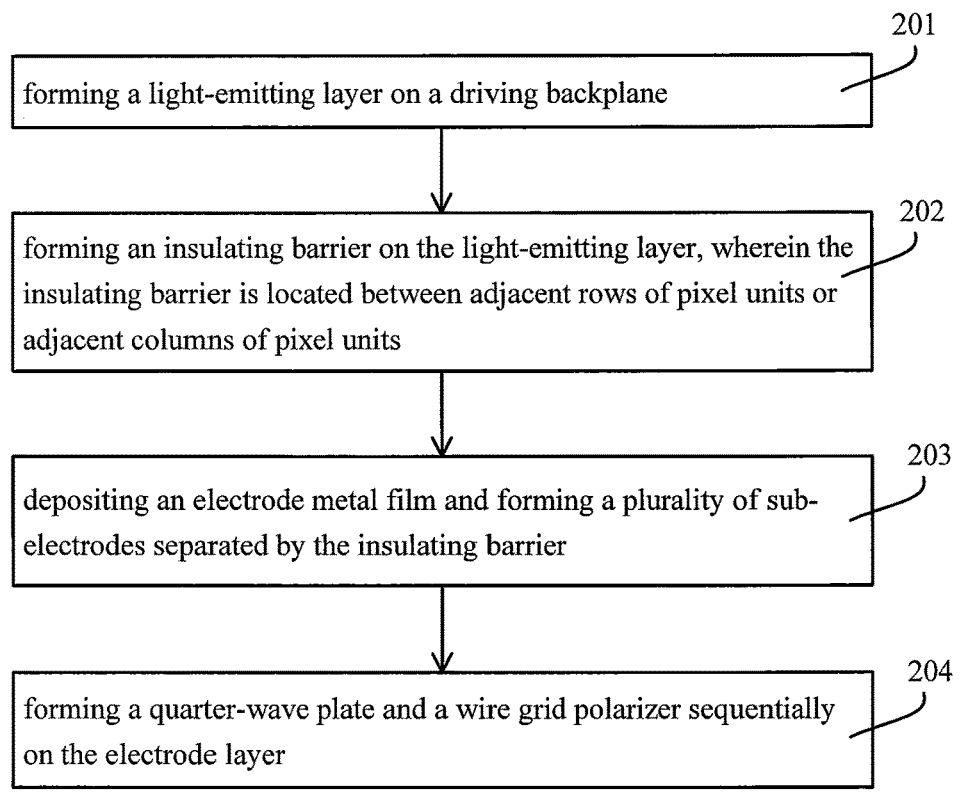
FIG. 12 illustrates a production flow chart of an OLED display panel according to another embodiment of the present application.

With reference to FIG. 12, an embodiment of the present application provides a specific production method for an OLED display panel. The production method comprises: step 201, forming a light-emitting layer on a driving backplane; step 202, forming an insulating barrier on the light-emitting layer, wherein the insulating barrier is located between adjacent rows of pixel units or adjacent columns of pixel units; step 203, depositing an electrode metal film (in particular, a cathode metal film), and forming a plurality of sub-electrodes (in particular, a plurality of cathode sub-electrodes) separated by the insulating barrier; and step 204, forming a quarter-wave plate and a wire grid polarizer sequentially on the electrode layer.

Optionally, before forming the quarter-wave plate, an encapsulating film may further be formed on the electrode layer.

An embodiment of the present application provides a driving method for an electroluminescent display panel (in particular, an OLED display panel) as described above. The driving method comprises: loading a display signal to sub-electrodes of the electrode layer (exemplarily, cathode sub-electrodes of the cathode layer) during a display stage; and loading a touch driving signal to sub-electrodes of the electrode layer and detecting a touch sensing signal by at least part of the metal wires of the wire grid polarizer during a touch stage.

Optionally, during the touch stage, the touch sensing signal is detected by a metal wire(s) corresponding to a gap between adjacent rows of sub-pixel units or adjacent columns of sub-pixel units of the light-emitting layer.

Figure 13:
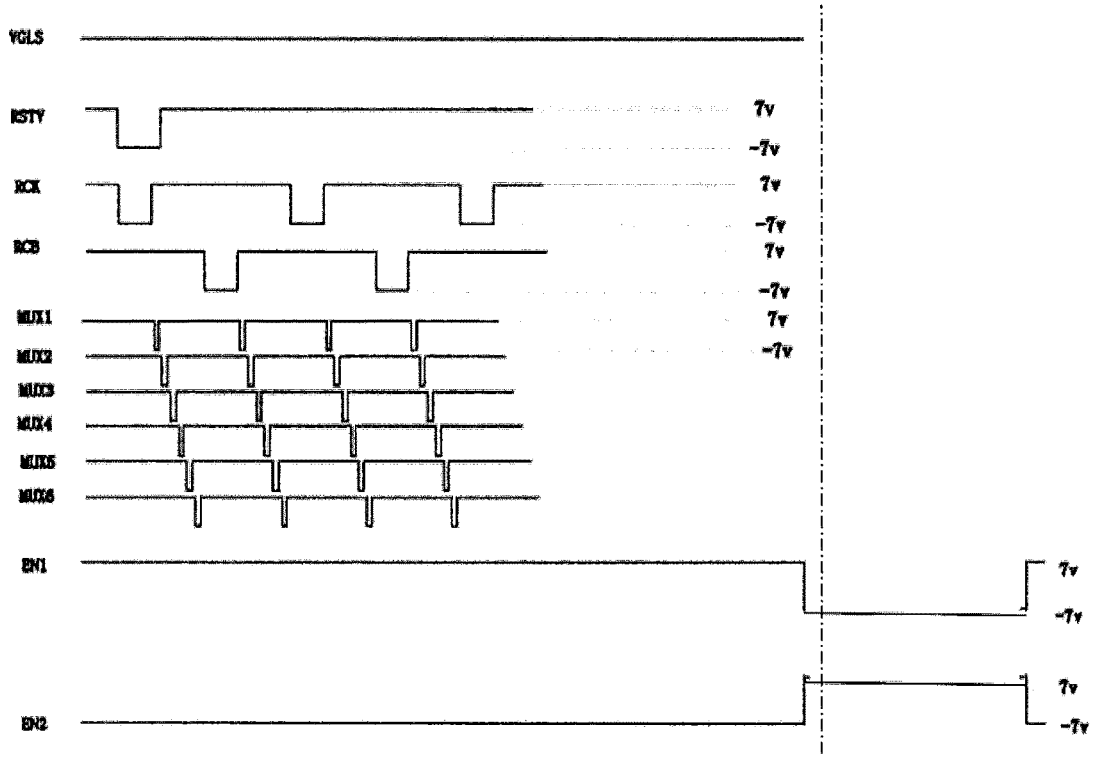
FIG. 13 illustrates a timing diagram of a display panel according to an embodiment of the present application.

FIG. 13 illustrates a timing diagram of a display panel according to an embodiment of the present application. In FIG. 13, VGLS, RSTV, RCX, RCB represent display pulse signals, MUX1, MUX2, MUX3, MUX4, MUX5, MUX6 represent switch signals of a multiplexer, and EN1, EN2 represent touch & display sync signals. When EN1 is at a high level and EN2 is at a low level, the display panel is at the display stage. Similarly, when EN1 is at a low level and EN2 is at a high level, the display panel is at the touch stage. It needs to be noted that, FIG. 13 is an illustration taking that the high level is 7V and the low level is −7V as an example. However, this should not be construed as any limitation to the present application in any way.

In summary, embodiments of the present application provide an electroluminescent display panel, in particular, an OLED display panel. In the display panel, the quarter-wave plate and the wire grid polarizer are disposed sequentially above the light-emitting unit. In particular, part or all of the metal wires of the wire grid polarizer may transmit a touch sensing signal during the touch stage of the display panel. That is, the polarizer of the display panel may not only have the polarization function, but also be reused as a touch sensing electrode. In addition, the electrode layer of the electroluminescent display panel comprises a plurality of sub-electrodes insulated from each other. These sub-electrodes may transmit an electrode signal during the display stage of the display panel and may transmit a touch driving signal during the touch stage of the display panel. That is, an electrode (a cathode as an example) of the electroluminescent display panel may be reused as a touch driving electrode. In such a way, the electroluminescent display panel may avoid using a separate touch screen, thereby reducing thickness of the electroluminescent display panel, and improving further brightness and flexibility & tortuosity of the electroluminescent display panel.

Clearly, various modifications and variations may be made to the present application by a person having skills in the art without departing from the spirit and scope of the present application. As such, the application is also intended to comprise all these modifications and variations, if the modifications and variations of the present application pertain to the scope of the claims of the present application and the equivalence thereof.

The invention claimed is:

1. An electroluminescent display panel, comprising:
a light-emitting unit;
a quarter-wave plate on the light-emitting unit; and
a wire grid polarizer on a side of the quarter-wave plate opposite to the light-emitting unit, wherein the light-emitting unit comprises a driving backplane, a light-emitting layer and an electrode layer,
wherein the electrode layer comprises a plurality of sub-electrodes extending along a first direction and insulated from each other, the plurality of sub-electrodes being configured to transmit an electrode signal during a display stage of the display panel and transmit a touch driving signal during a touch stage of the display panel,
wherein the wire grid polarizer comprises a plurality of metal wires extending along a second direction,
wherein the second direction intersects the first direction,
wherein the light-emitting layer comprises a plurality of sub-pixel units distributed in an array, the plurality of metal wires comprise multiple first portions serving as touch sensing electrodes and multiple second portions for generating light polarization effect,
wherein each first portion of the multiple first portions and each second portion of the multiple second portions comprise at least two metal wires, and the first portion and the second portion are arranged alternately along the first direction,
wherein orthographic projections of the at least two metal wires of each first portion on the light-emitting layer coincide with a single gap between adjacent rows or adjacent columns of sub-pixel units on the light-emitting layer,
and wherein the at least two metal wires of each first portion are connected to each other via metal connection wires to form a mesh-like structure.

2. The electroluminescent display panel of claim 1,
wherein, the light-emitting unit further comprises an insulating barrier on the light-emitting layer, and
wherein the insulating barrier is between the adjacent rows or adjacent columns of the sub-pixel units, and divides the electrode layer into the plurality of sub-electrodes.

3. The electroluminescent display panel of claim 1, further comprising:

an encapsulating film between the light-emitting unit and the quarter-wave plate.

4. The electroluminescent display panel of claim 1, further comprising:
a substrate plate on a side of the light-emitting unit opposite to the quarter-wave plate,
wherein, the wire grid polarizer further comprises a wire grid polarizer substrate, and
wherein the wire grid polarizer substrate and the substrate plate are made of a same material.

5. The electroluminescent display panel of claim 1, wherein the display panel comprises an AMOLED display panel.

6. A display apparatus, comprising the electroluminescent display panel of claim 1.

7. A production method for an electroluminescent display panel according to claim 1, comprising:
forming the light-emitting layer and the electrode layer sequentially on the driving backplane, wherein the electrode layer comprises the plurality of sub-electrodes extending along the first direction and insulated from each other; and
forming the quarter-wave plate and the wire grid polarizer sequentially on the electrode layer, wherein the wire grid polarizer comprises the plurality of metal wires extending along the second direction,
wherein the second direction intersects the first direction.

8. The production method for an electroluminescent display panel of claim 7, wherein the production method further comprises:
before forming the electrode layer, forming an insulating barrier on the light-emitting layer, wherein the insulating barrier is located between adjacent rows or adjacent columns of the sub-pixel units,
wherein the forming the light-emitting layer and the electrode layer comprises depositing an electrode metal film and patterning the electrode metal film to form the plurality of sub-electrodes, and
wherein the plurality of sub-electrodes are separated from one another by the insulating barrier.

9. The production method for an electroluminescent display panel of claim 7, further comprising:
before forming the quarter-wave plate, forming an encapsulating film over the electrode layer.

10. The production method for an electroluminescent display panel of claim 7,
wherein, the forming the quarter-wave plate and the wire grid polarizer comprises forming metal connection wires between ones of the metal wires of the wire grid polarizer,
wherein the metal connection wires and the ones of the metal wires comprise the mesh-like structure.

11. A driving method for the electroluminescent display panel of claim 1, comprising:
loading a display signal to ones of the plurality of the sub-electrodes of the electrode layer during the display stage; and
loading the touch driving signal to sub-electrodes of the electrode layer and detecting the touch sensing signal by at least one of the plurality of the metal wires of the wire grid polarizer during the touch stage.

12. The driving method for the electroluminescent display panel of claim 11,
wherein, the light-emitting layer comprises a plurality of sub-pixel units distributed in an array, and
wherein during the touch stage, the touch sensing signal is detected by at least one of the plurality of metal wires corresponding to a gap between adjacent rows or adjacent columns of the sub-pixel units.

13. The display apparatus of claim 6,
wherein, the electroluminescent display panel further comprises an encapsulating film between the light-emitting unit and the quarter-wave plate.

14. The display apparatus of claim 6,
wherein, the electroluminescent display panel further comprises a substrate plate on a side of the light-emitting unit opposite to the quarter-wave plate,
wherein, the wire grid polarizer further comprises a wire grid polarizer substrate, and
wherein the wire grid polarizer substrate and the substrate plate are made of a same material.

15. The display apparatus of claim 6, wherein the display panel comprises an AMOLED display panel.

* * * * *